United States Patent
Okano et al.

[11] Patent Number: 5,815,094
[45] Date of Patent: Sep. 29, 1998

[54] POSITION DETECTING DEVICE

[75] Inventors: Hiroshi Okano, Tokyo; Yoshiharu Shiokama, Chiba-ken; Shinichi Ushio; Kazumitsu Takezawa, both of Yokohama, all of Japan

[73] Assignee: Nikon Corporation, Tokyo, Japan

[21] Appl. No.: 958,478

[22] Filed: Oct. 28, 1997

Related U.S. Application Data

[63] Continuation of Ser. No. 723,506, Sep. 30, 1996, abandoned, which is a continuation of Ser. No. 546,063, Oct. 20, 1995, abandoned, which is a continuation of Ser. No. 322,373, Oct. 13, 1994, abandoned, which is a continuation of Ser. No. 226,374, Apr. 12, 1994, abandoned, which is a continuation of Ser. No. 883,572, May 15, 1992, abandoned.

[30] Foreign Application Priority Data

| May 21, 1991 | [JP] | Japan | 3-145591 |
| May 21, 1991 | [JP] | Japan | 3-145592 |
| Jul. 15, 1991 | [JP] | Japan | 3-063081 |

[51] Int. Cl.⁶ .................................................. H03M 1/22
[52] U.S. Cl. .................................................. 341/16; 396/63
[58] Field of Search .................................. 341/1, 16, 178; 200/252, 253; 340/825.57, 825.64, 671, 672, 686; 396/63

[56] References Cited

U.S. PATENT DOCUMENTS

| 4,949,087 | 8/1990 | Miyazawa | 341/16 |
| 4,978,981 | 12/1990 | Satoh et al. | 354/410 |

FOREIGN PATENT DOCUMENTS

| 1-64607 | 4/1989 | Japan . |
| 1-85812 | 6/1989 | Japan . |
| 1-139208 | 9/1989 | Japan . |
| 3-24618 | 3/1991 | Japan . |

*Primary Examiner*—Thomas J. Mullen, Jr.
*Attorney, Agent, or Firm*—Shapiro and Shapiro

[57] ABSTRACT

A position detecting device comprises a pattern member having conductive patterns arranged in plural tracks; a slidable member having plural sliding pieces capable of sliding on the conductive patterns, wherein each of the sliding pieces assumes either a conductive state in contact with one of the conductive patterns or a non-conductive state not in contact with the conductive pattern; a signal processing device for detecting sets of the conductive patterns and the sliding pieces in conductive state, by transmitting electrical signals through the conductive patterns and the sliding pieces; and a discriminating device for identifying the relative position between the conductive patterns and the sliding pieces when the the conductive patterns and the sliding pieces in conductive state are detected at least a predetermined number of times or over at least a predetermined period of time.

20 Claims, 5 Drawing Sheets

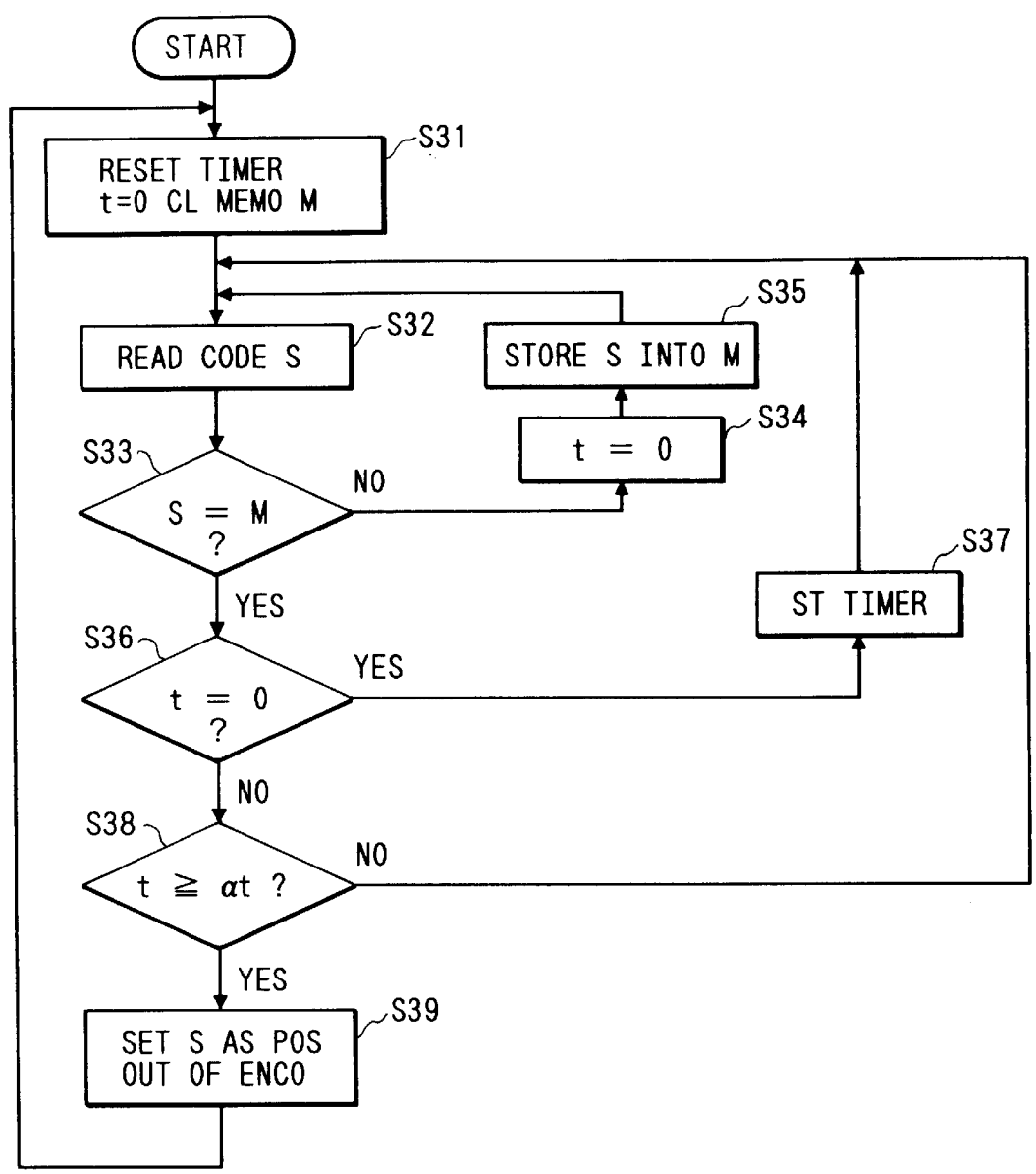

POSITION DETECTING DEVICE

This is a continuation of application Ser. No. 08/723,506 filed Sep. 30, 1996, which is a continuation of application Ser. No. 08/546,063 filed Oct. 20, 1995, which is a continuation of application Ser. No. 08/322,373 filed Oct. 13, 1994, which is a continuation of application Ser. No. 08/226,374 filed Apr. 12, 1994, which is a continuation of application Ser. No. 07/883,572 filed May 15, 1992, all now abandoned.

BACKGROUND OF THE INVENTION

1. Field of the Invention

The present invention relates to a position detecting device, and more particularly a technology, useful in a device for generating predetermined signal codes at different positions by sliding motion of sliding pieces or brushes on conductive patterns, for preventing generation of erroneous signals by defective contacts or chattering between the brushes and the conductive patterns.

2. Related Background Art

For example, in a zoom lens for a camera, it is already known to correct the diaphragm aperture and the amount of light emission from an electronic flash unit according to the regulation of the focal length. For such correction it is necessary to detect the set position of the focal length of the zoom lens.

For this purpose there is employed a signal generating device as shown in FIG. 4, comprising an arc-shaped conductive pattern member 5 bearing thereon conductive patterns 5a1, 5a2, 5a3, 5a4 constituting plural tracks, and a brush member 6 provided with plural brushes 6a, 6b, 6c, 6d sliding respectively on said conductive patterns 5a1, 5a2, 5a3, 5a4. The brushes 6a, 6b, 6c, 6d are mutually short circuited and respectively slide on the conductive patterns 5a1, 5a2, 5a3, 5a4 together with the movement of the zoom lens barrel. The conductive pattern 5a4 is taken, for example, as a ground pattern, with which the pattern 5a1, 5a2 or 5a3 is short circuited according to the position of the brush member 6. Therefore, code signals can be obtained from the conductive patterns depending on the position of the brush member 6.

Such a such signal generating device has been associated with a drawback of erroneous signal generation by so-called chattering, resulting from bouncing of the brushes at their sliding motion on the conductive patterns and on the insulating portions. Also, such errors in the signals may arise from defective contacts between the brushes and the conductive patterns, due, for example, to smears on the conductive patterns or on the brushes.

With such conductive patterns 5a1–5a4, an end pattern such as 5a1 is considered as an important position, and a code signal for reversing the drive is released when the brush member 6 reaches this position.

In such case, as will be apparent from FIG. 9, if defective contact arises between the conductive pattern 5a1 and the corresponding brush when the brush member arrives at a position B, the generated code signal becomes the same as that of the important position 26a, thereby leading to a serious error in function such as inversion of the driving direction. Also, if defective contact arises between the conductive pattern 5a1 and the corresponding brush when the brush member arrives at a position A, the generated code signal becomes the same as that of another important position 26b, resulting in another serious error in function.

SUMMARY OF THE INVENTION

In consideration of the foregoing, an object of the present invention is to provide a position detecting device capable of preventing generation of erroneous signals by defective contact or chattering between the conductive pattern and the brush and enabling precise detection of position.

Another object of the present invention is to prevent generation of a signal code the same as that of an important position, even in the presence of chattering or defective contact between the conductive pattern and the corresponding brush, thereby effectively preventing serious error in the function of a device.

The above-mentioned objects can be attained, according to the present invention, by a position detecting device provided with a pattern member having conductive patterns which are arranged on plural tracks and are adapted to provide plural signal lines with predetermined signal codes depending on different positions, a slidable member having plural sliding pieces capable of sliding on the tracks of said conductive patterns, and signal process means for reading said code signals by the contact between said pattern member and said slidable member and detecting the position based on said code signals, said position detecting device comprising signal discrimination means for reading said signal code plural times and recognizing said read signal code as a proper signal code when a same signal code is read at least for a predetermined number of times.

Also, the position detecting device of the present invention, may have a pattern member, slidable member and signal process means as mentioned above, and may further include signal discrimination means adapted to read said signal code plural times and recognize said signal code as a proper signal code when a same signal code is read over at least a predetermined time.

In the first-mentioned position detecting device, said signal discrimination means reads the signal code corresponding to the relative position of said pattern member and brush member, but said signal code is recognized as a proper signal code only when the same signal code is read a predetermined plural number of times. Consequently the probability of generation of erroneous signals, such as by chattering, becomes extremely small and precise detection of position is rendered possible.

Also, in the second-mentioned position detecting device, said signal discrimination means reads the signal code corresponding to the relative position of said pattern member and brush member, but said signal code is recognized as a proper signal code only when the same signal code is read over a predetermined time. Consequently the probability of generation of erroneous signals, such as by chattering, becomes extremely small and precise detection of position is rendered possible.

The above-mentioned objects can also be attained, according to the present invention, by a position detecting device provided with a pattern member having conductive patterns which are arranged on plural tracks and are adapted to provide plural signal lines with predetermined signal codes depending on different positions, a slidable member having plural sliding pieces capable of sliding on the tracks of said conductive patterns, and signal process means for reading said code signals by the contact between said pattern member and said slidable member and detecting the position based on said code signals, said position detecting device comprising memory means which stores in advance a train of proper code signals to be generated by said conductive patterns at the different positions, and comparator means for discriminating the adequateness of the code signal read from said signal lines by comparison of said code signal with the train of code signals stored in said memory means.

Said comparator means is advantageously so constructed as to discriminate the read code signal as a proper code signal when the read code signal is same as the previously read one, or, if not the same, the read code signal varies according to the sequence of code signal train stored in said memory means.

In the above-mentioned position detecting device, the memory means in advance stores a train of proper code signals to be generated when said slidable member moves to different positions with respect to said conductive patterns. Said comparator means discriminates the code signal read from the signal lines as a proper code signal when said read code signal is the same as the previously read one, or, if not the same, said read code signal varies from the previously read one according to the sequence of code signal train stored in said memory means. If the read code signal varies according to the sequence of said code signal train, the slidable member is considered to have moved to a next position between the previous code signal reading and the present code signal reading, so that the code signal is identified to be properly generated.

The foregoing objects can further be attained, according to the present invention, by a signal setting device provided with a pattern member having conductive patterns which are arranged on plural tracks and are adapted to provide plural signal lines with predetermined signal codes depending on different positions, and a brush member having plural brushes mutually connected electrically and capable of sliding on the tracks of said conductive patterns, wherein said conductive patterns are so constructed that erroneous signals codes generated by defective contact between said conductive patterns and the corresponding brushes, are different from the signal code corresponding to an important position.

For example, the signal code corresponding to the important position may be so constructed that two or more signal lines which do not become conductive at the same time in normal positions are conductive, or that all the signal lines are conductive.

In the above-explained structure, even when conduction failure occurs by chattering or defective contact in one or more sets of conductive pattern and corresponding brush in one of the normal positions, the signal code generated in such situation is different from the signal code at the important position. For this reason such signal code is not mistaken for an important signal code. Also, in case a signal code including conductive state in two or more lines which do not assume the conductive state at the same time in normal positions is taken as the signal code for an important position, an erroneous signal code generated, such as by chattering, in the course of signal reading at normal positions is not mistaken for an important signal code. The applies to a case in which a signal code, with all the signal lines in the conductive state, is taken as the signal code for such important position.

BRIEF DESCRIPTION OF THE DRAWINGS

FIG. 3 is a flow chart of the control sequence of the position detecting device constituting another embodiment of the present invention;

DESCRIPTION OF THE PREFERRED EMBODIMENTS

Figure 1:
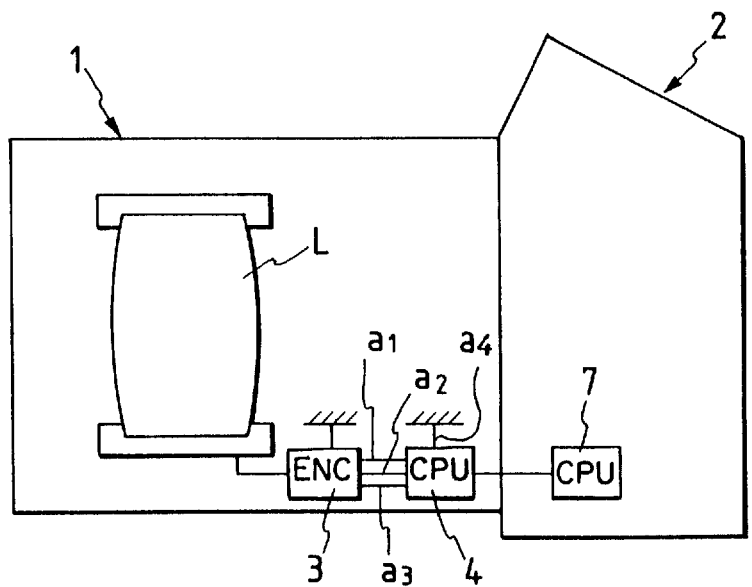
FIG. 1 is a schematic block diagram of a camera employing a position detecting device of the present invention.

In the following there will be explained an embodiment of the present invention, with reference to the attached drawings. FIG. 1 illustrates the structure of a camera employing a position detecting device embodying the present invention. The illustrated camera consists of an interchangeable lens 1 with an automatic focusing mechanism and a camera body 2. Said automatic focusing mechanism can be of known structure, and therefore will not be explained further.

Figure 4:
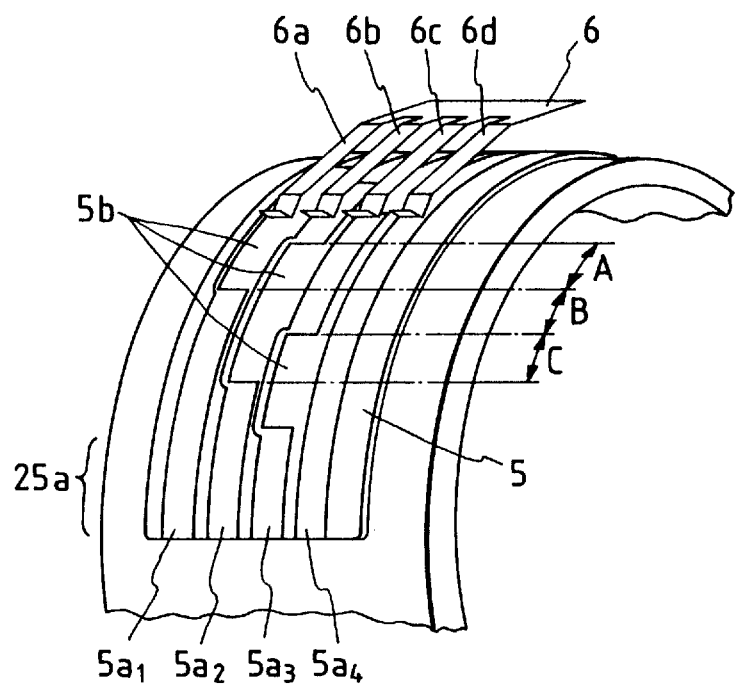
FIG. 4 is a perspective view showing details of an encoder for code signal generation.

The interchangeable lens 1 is provided with a focusing optical system L, an encoder 3, and a CPU 4 composed, for example, of a one-chip microcomputer. The encoder 3 has the aforementioned structure shown in FIG. 4, in which the brush member moves on the conductive patterns along with the movement of the focusing optical system L.

Signal lines a1, a2, a3 respectively connected to the conductive patterns 5a1, 5a2, 5a3 of the encoder 3 and a ground line a4 are connected to ports of the CPU 4, which thus reads the code signals from said encoder 3. More specifically, a voltage of +5 V, for example, is applied through a resistor (not shown) to the signal lines a1, a2, a3, which are selectively short circuited with the ground line a4 by the brush member, depending on the shape of the conductive patterns, whereby the CPU 4 can detect the conduction or non-conduction state between the signal lines a1, a2, a3 and the ground line a4 as low and high-level signals. In this manner the CPU 4 receives a code signal corresponding to the position of the brush member.

In FIG. 1, the CPU 4 principally identifies the adequateness of the code signal entered from the encoder 3, as will be explained later. A CPU 7, composed of a one-chip microcomputer and provided in the camera body 2, effects control necessary for phototaking operations, such as auto focusing and exposure control.

In the following there will be explained the prevention of erroneous signals by the CPU 4. The encoder 3 shown in FIG. 1 has the structure shown in FIG. 4 with conductive patterns 5a1–5a4, among which the pattern 5a4 is at the ground level. Insulating portions of the patterns are indicated by 5b. The brush member 6 is equipped with four brushes 6a, 6b, 6c, 6d and is at the ground level in normal state. When the brush member 6 is in a position range A of the pattern member 5, there is generated a code signal Sa with outputs to the CPU 4 shown in Table 1.

TABLE 1

| | [code Sa] | | |
|---|---|---|---|
| Input line to CPU | 5a1 | 5a2 | 5a3 |
| Status | High | High | Low |

Similarly, when the brush member 6 is in a position range B of the pattern member 5, there is generated a code signal Sb with outputs to the CPU 4 shown in Table 2.

TABLE 2

| | [code Sb] | | |
|---|---|---|---|
| Input line to CPU | 5a1 | 5a2 | 5a3 |
| Status | Low | High | Low |

Although said code signal Sb shown in Table 2 is to be generated when the brush member 6 is within the range B of the pattern member 5, a code signal Sa is instead generated if the brush 6a is lifted by bouncing as the conductive pattern 5a1 assumes the high level state.

Figure 2:
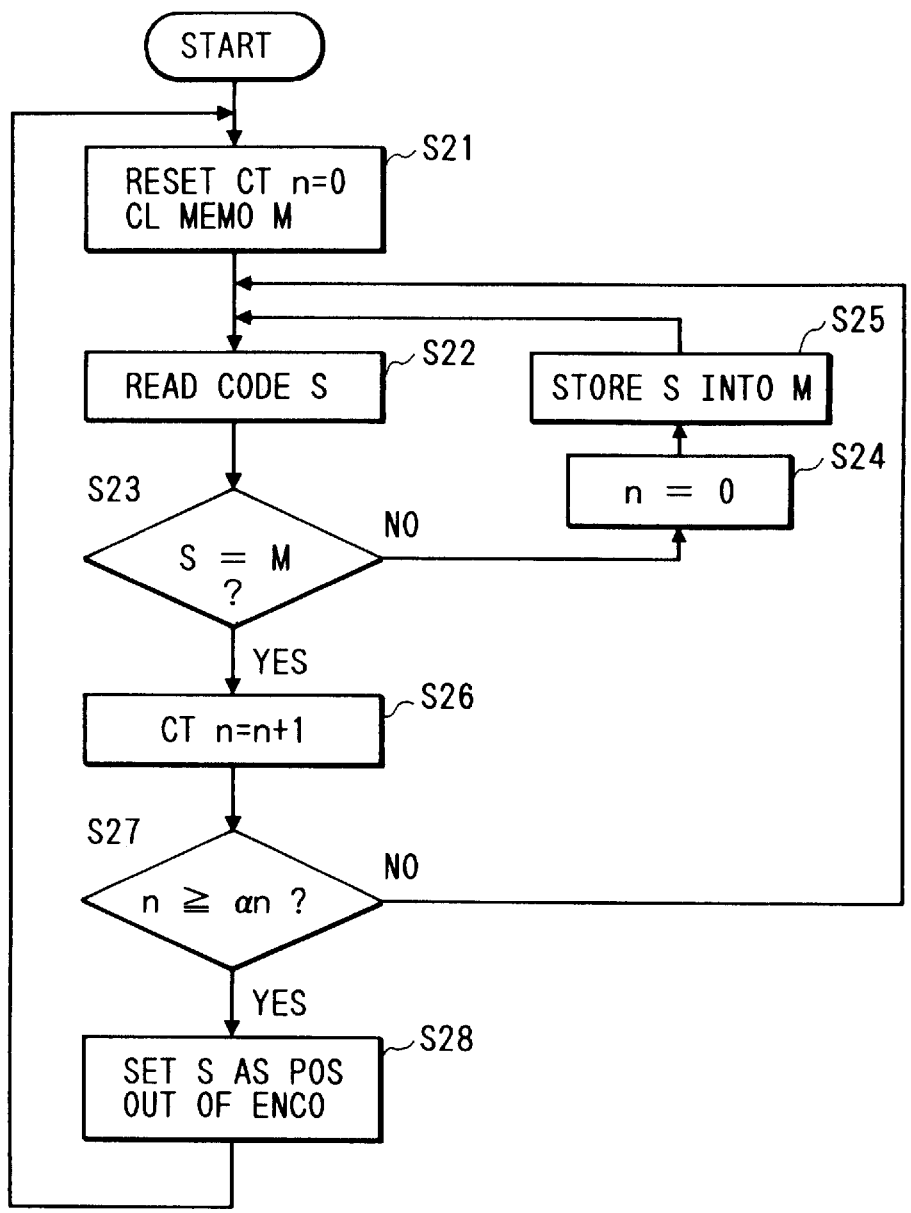
FIG. 2 is a flow chart of the control sequence of the position detecting device constituting a first embodiment of the present invention.

The CPU 4 prevents the generation of an erroneous output signal by a sequence shown in FIGS. 2 or 3. FIG. 2 shows the control sequence of the CPU 4 in the position detecting device constituting one embodiment of the present invention. When a code signal is provided from the encoder 3, a counter in the CPU 4 is reset to a count n=0, and a memory M for storing the entered code signal S is cleared (step S21). Then the code signal S is read for the first time (step S22) and is compared with the information in the memory M (step S23). If the code signal is different, the counter is reset to n=0 (step S24), and the read code signal S is stored in the memory (step S25). Then a second reading is conducted (step S22) and comparison with the information of the memory M is conducted in a similar manner as in the first time (step S23). If the code signals entered for the first and second readings are the same, the second reading becomes equal to the content of the memory M whereby the count n of the counter is increased by one (step S26). Then the content n of the counter is compared with a predetermined number $\alpha_n$ (step S27), and, if said content n is smaller, a third code reading is conducted (step S22) and is similarly processed. When the count n reaches $\alpha_n$ in the repetition of the above-explained sequence, the output of the current encoder position is identified as S (step S28). A proper signal code is thus detected and entered into the CPU 7 of the camera body 2. Subsequently reading of the next code signal is initiated in a similar manner.

FIG. 3 shows the control sequence of the CPU 4 in the position detecting device constituting another embodiment of the present invention. In this embodiment, a proper code signal is identified if a same code signal is entered for a predetermined period $\alpha_t$, instead of the number $\alpha_n$ of times of entries of same code signal as in the foregoing embodiment. Referring to FIG. 3, when a code signal is provided from the encoder 3, a timer in the CPU 4 is reset to t=0, and a memory M for storing the code signal S is cleared (step S31). Then the code signal S is read for the first time (step S32) and is compared with the content of the memory M (step S33). If both are different, the timer is reset to t=0 (step S34), and the read code signal is stored in the memory M (step S35).

Subsequently the code signal is read for the second time (step S32) and is compared with the content of the memory M as in the first time (step S33). If the code signals read for the first and second times are the same, the code signal read at the second reading becomes equal to the content of the memory M, and there is discriminated whether the timer is set at t=0 (step S36). If the timer is identified to be at t=0, starting of the timer is instructed (step S37). Then a third reading is conducted (step S32). If the read code signal is same as the content of the memory M, the timer is not at t=0 (step S36) as it has already been started. In this case the time t of the timer is compared with a predetermined time $\alpha_t$ (step S38), and, if t is shorter, a fourth reading is conducted in a similar manner (step S32). When the time t reaches $\alpha_t$ in the repetition of the above-explained sequence, the output of the current encoder position is identified as S (step S39). Subsequently reading of the next code signal is initiated in a similar manner.

In the present invention, as explained in the foregoing, the code signal is read plural times, and the read code signal is identified as a proper code signal when the same code signal is read for a predetermined number of times or for a predetermined period. Therefore, erroneous detection of position can be prevented even when an erroneous signal is temporarily generated, such as by chattering, and errors in the camera functions can thus be avoided.

Figure 5:
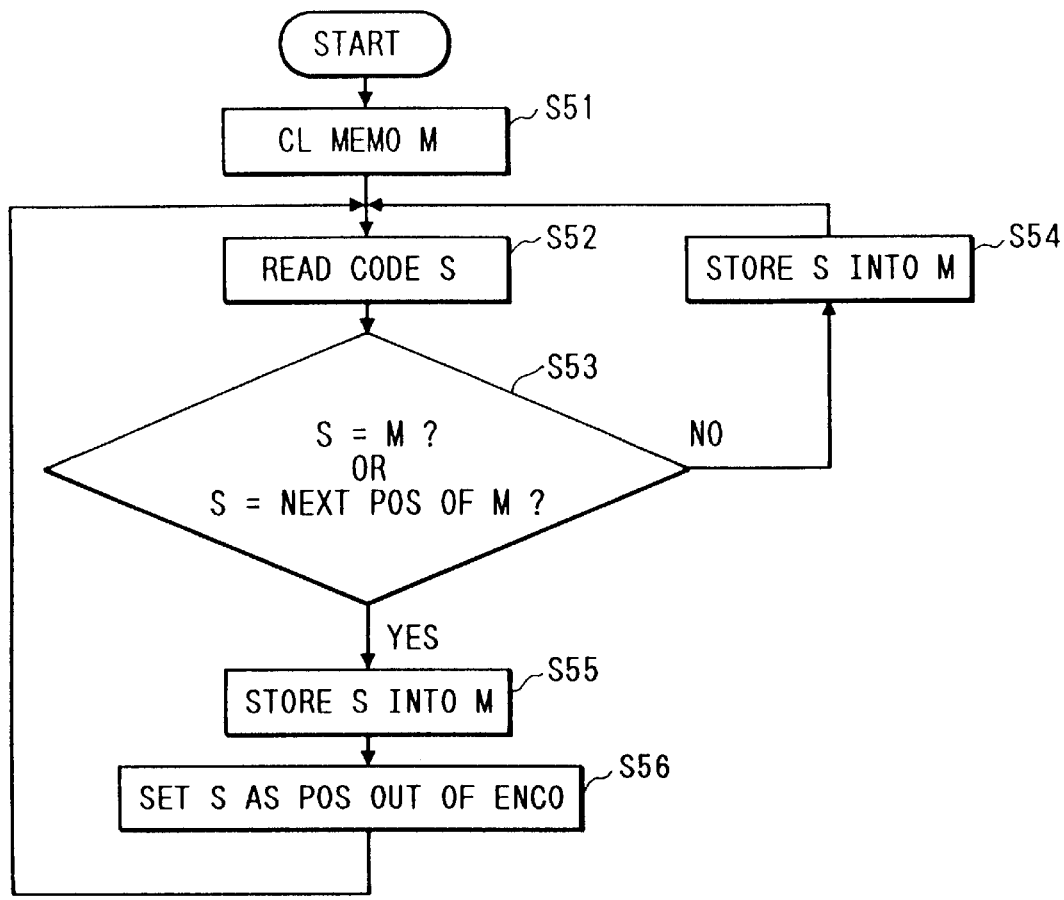
FIG. 5 is a flow chart of the control sequence of the position detecting device constituting still another embodiment of the present invention.

FIG. 5 shows the control sequence of the CPU 4 for preventing the generation of error signals in a position detecting device constituting still another embodiment of the present invention. When a code signal is provided from the encoder 3, a memory M in the CPU 4 is cleared (step S51). Said memory M provides a work area for temporarily storing the entered code signal as a reference code.

Then, the code signal S is read for the first time (step S52), and comparison is conducted in order to discriminate whether said read code signal S is equal to a reference code stored in said memory M or codes adjacent to said reference code (step S53). If said read code signal S is not equal to the reference code nor the adjacent codes, the read code signal S is stored in the memory M (step S54), and a second code reading is conducted (step S52). At the first code reading, said comparison indicates the absence of coincidence because the memory M is cleared in advance.

Then the code signal S read in the second reading is compared, as in the first time, with the reference code stored in the memroy M or with the code adjacent to said reference code (step S53). The CPU 4 stores, in an internal memory, a train of proper signal codes to be generated corresponding to the different positions of the encoder 3, and said comparison with the adjacent code is conducted by the comparison of the read code signal with said train of signal codes. If the code signal S read in the second reading coincides with the code signal read in the first reading, namely the reference code stored in the memory M, said code signal read in the second reading is stored as the reference code in the memory M (step S55), and is identified as the proper current output of the encoder (step S56). Also, when the code signal read in the second reading coincides with a code signal adjacent to the reference code signal which is read in the first reading and stored in the memory M, the code signal S read in the second reading is stored as a new reference code in the memory M (step S55) and identified as the proper current output of the encoder (step S56).

In the following there will be explained a specific example. If the brush member 6 is within the range B of the encoder pattern 5 at the first code signal reading, there is read the code Sb shown in Tab. 2. Said code signal Sb is compared with the content of the memory M. Since the memory M has been cleared in advance, the code Sb is identified as the reference code and stored in the memory M.

Then the second code reading is conducted, and, if the read code S is again Sb, it coincides with the reference code stored in the memory M. Said code Sb is therefore stored as the reference code in the memory M, and the output corresponding to the current encoder position is identified as Sb.

If an erroneous code Sx induced by a brush chattering at the second code reading is entered and is different from the reference code Sb or the adjacent codes Sa, Sc, said code Sx is set as the reference code in the memory M. Then, if the proper code Sb is entered at the third code reading, comparison is conducted in a similar manner as explained above and the code Sb is again stored as the reference code in the memory M. Then, if the code Sb is again entered at the fourth reading, the entered code coincides with the reference code. Therefore, said code Sb is stored as the reference code in the memory M and is identified as the proper output corresponding to the current encoder position. Said identification is executed, for example, by storing said code Sb, as the output corresponding to the current encoder position, in a predetermined work area of the memory, and said code Sb stored in said work area is subsequently sent to the CPU 7 of the camera body 2.

In the above-explained sequence, the read code S is considered to match the reference code if said read code S coincides with the reference code or with one of the adjacent codes. This is based on a concept that the error in detection of position can be tolerated to the adjacent codes and is in consideration of the possibility that the code reading takes place at the boundary of different positions of the encoder in the course of movement of the brush. However, the present invention is not limited to the coincidence of the read code with one of the reference code and the adjacent codes, but may also be expanded to the coincidence of the read code with one of the reference code, adjacent codes thereof and codes adjacent to said adjacent codes.

According to the present invention, as explained in the foregoing, a proper code signal is identified in consideration of the case that the read code signal has varied according to the code train corresponding to the different positions of the encoder. Therefore, even if an erroneous code is temporarily generated, such as by chattering, an erroneous detection of position based on such code can be prevented a proper and the code signal can be identified reliably, in consideration of the status of actual use such as the movement of the brush member.

Figure 6:
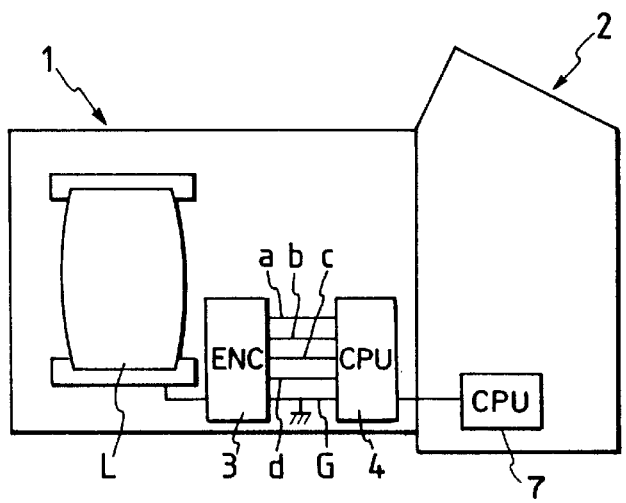
FIG. 6 is a schematic block diagram of a camera employing a signal setting device of the present invention.

In the following there will be explained still another embodiment of the present invention. FIG. 6 illustrates the structure of a camera employing a signal setting device embodying the present invention. The illustrated camera consists of an interchangeable lens 1 with an automatic focusing mechanism, and a camera body 2. Said automatic focusing mechanism can be of known structure, and therefore will not be explained further.

The interchangeable lens 1 is provided with a focusing optical system L, an encoder 3, and a CPU 4 composed, for example, of a one-chip microcomputer. The encoder 3 has the aforementioned structure shown in FIG. 4, in which the brush member moves on the conductive patterns along with the movement of the focusing optical system L.

Signal lines a, b, c, d respectively connected to the conductive patterns of the encoder 3 and a ground line G are connected to ports of the CPU 4, which thus reads the code signals from said encoder 3. More specifically, a voltage of, for example, +5 V is applied through a resistor (not shown) to the signal lines a, b, c, d which are selectively short circuited with the ground line G by the brush member, depending on the shape of the conductive patterns, whereby the CPU 4 can detect the conduction or non-conduction state between the signal lines a, b, c, d and the ground line G as low- and high-level signals. In this manner the CPU 4 receives a code signal corresponding to the position of the brush member.

Figure 7:
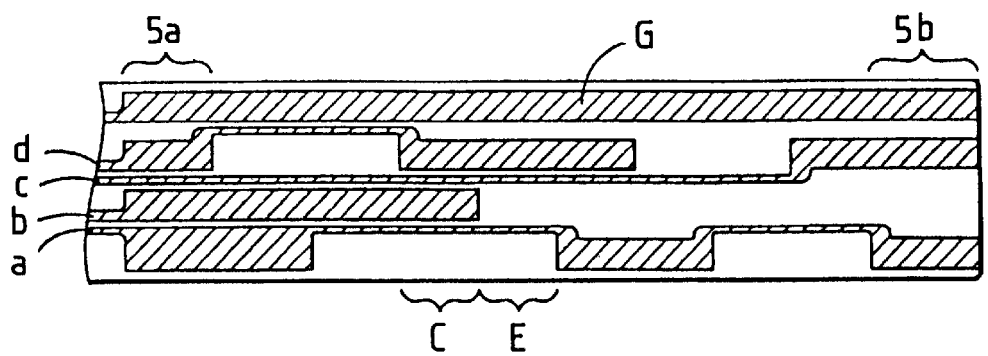
FIG. 7 is a view showing the arrangement of conductive patterns in a signal setting device embodying the present invention.

FIG. 7 shows an example of the conductive pattern member employed in the encoder 3 shown in FIG. 6. Said conductive pattern member is provided, for example, on a flexible printed circuit board (FPC), with conductive patterns being shown by hatched areas. End portions 5a, 5b of the conductive patterns serve for generating code signals for reversing the driving direction of the focusing optical system L and constitute important positions in the system. Positions between said important positions 5a, 5b are normal positions for detecting the position of the focusing optical system L.

The ground pattern G is formed continuously so that it is in contact with the corresponding brush regardless of the position. Each of said signal lines can be short circuited with the ground pattern through the brush member depending on the presence or absence of the conductive pattern, whereby a code signal corresponding to the brush position is applied to the CPU 4. Stated differently, the position of the brush member can be identified by the combination of conductive and non-conductive states between the signal lines a, b, c, d and the ground line G. In the present embodiment, when the brush member moves to the right from a certain position and reaches the important position 5b, the driving direction is reversed to the left by a code signal generated at said important position.

In the conductive patterns shown in FIG. 7, two or more signal lines which assume the conductive state in the important positions 5a, 5b do not assume the conductive state simultaneously in the normal positions. Therefore, even if a signal line which should be in the conductive state becomes non-conductive because of chattering, for example there is not generated a code signal the same as that of the important position. Stated differently, the patterns containing additional conductive lines, in addition to the conductive patterns at the important positions, should not be present at the normal positions.

The above-mentioned condition can be met if a plurality or all the signal lines are made conductive with the ground line G at the important positions. In case of the patterns shown in FIG. 7, the signal lines a, b and d are shortcircuited with the ground line G at the important position 5a, but these three lines do not become conductive at the same time in other positions, for example C and E. Also the signal lines a and c are conductive with the ground line at the important position 5b, but these two lines do not assume the conductive state simultaneously at other positions. Consequently an error signal generated such as by chattering cannot be mistaken for the signals of the important positions.

The configuration of FIG. 7, not requiring a conductive pattern nor a signal line exclusive for the detection of important positions, allows reduction of the width of the conductive pattern member and the number of ports of the CPU 4.

Figure 8:
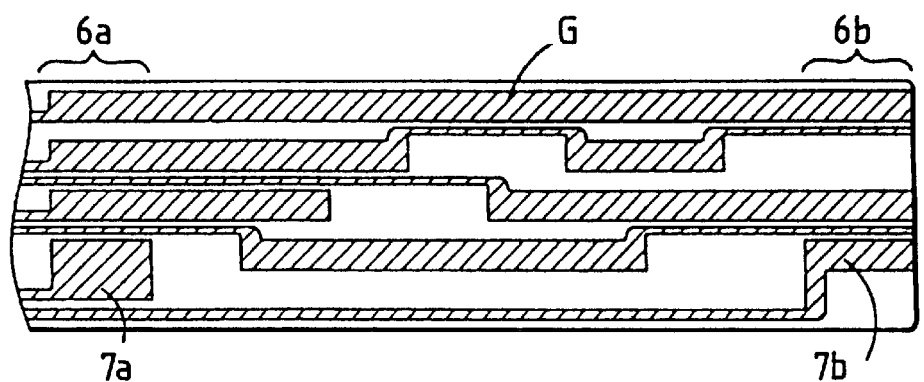
FIG. 8 is a view showing the arrangement of conductive patterns in a signal setting device constituting another embodiment of the present invention.
Figure 9:
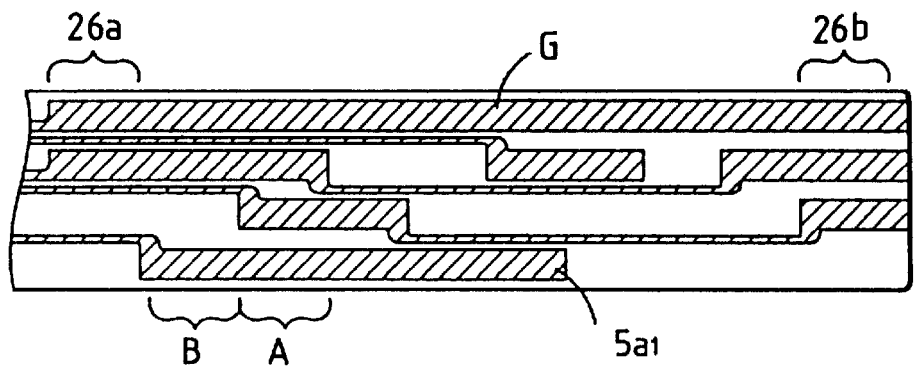
FIG. 9 is a view showing the arrangement of conductive patterns in a conventional signal setting device.

FIG. 8 illustrates a flexible printed circuit board constituting the conductive pattern member in another embodiment of the signal setting device of the present invention. In the present embodiment, exclusive conductive patterns 7a, 7b are provided in the important positions 6a, 6b at both ends. Between said conductive patterns 7a, 7b there are provided normal positions for detecting the position of the focusing optical system L.

In the conductive patterns shown in FIG. 8, there are provided signal lines connected to the conductive patterns 7a, 7b at the important positions 6a, 6b, and, when the brush member reaches one of these important positions 6a, 6b, the exclusive conductive pattern 7a or 7b is short circuited with the ground pattern G so that the presence of the brush member in one of these important positions can be easily recognized. In the normal positions, even if a non-conductive state occurs by chattering in any of the signal lines, for example, the resulting code signal is different from that of the important position since the exclusive conductive patterns 7a, 7b are not short circuited with the ground pattern G. The present configuration provides an advantage of increased freedom for pattern designing in the normal positions, because exclusive conductive patterns are employed for identifying the important positions.

Although the important positions are defined at the end portions of conductive patterns in the foregoing description, the important positions may be provided among the normal positions, or may be increased in number. Also, said important positions are defined in the foregoing description for providing code signals for reversing the driving direction of a lens device, but the present invention is applicable generally to mechanical devices provided with position dependent electronic control.

As explained in the foregoing, the present invention is capable of securely preventing erroneous functions fatal to the system, since the signals read in the normal positions are not mistaken, even in the presence of chattering or the like, for the signals of the important positions. Also, in case the conductive patterns and signal lines exclusive for the important positions are not employed, the width of the board constituting the conductive pattern member can be reduced, whereby the entire device can be made more compact. Also, in such case the number of ports of the CPU can be reduced, so that the CPU can be utilized in a more efficient manner.

What is claimed is:

1. A position detecting device comprising:
   a member having conductive patterns arranged in plural tracks;
   a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;
   signal process means for repeatedly detecting which of said sliding pieces are in the conductive state; and
   discrimination means for identifying a relative position between said member having conductive patterns and said sliding member in response to detection, by said signal process means, at least a predetermined plural number of times, of a same group of said sliding pieces being in the conductive state.

2. A position detecting device according to claim 1, wherein a code signal is generated according to the states of said sliding pieces, and said signal process means is adapted to read the code signal.

3. A position detecting device comprising:
   a member having conductive patterns arranged in plural tracks;
   a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;
   signal process means for repeatedly detecting which of said sliding pieces are in the conductive state; and
   discrimination means for identifying a relative position between said member having conductive patterns and said sliding member in response to repeated detections by said signal process means, at least over a predetermined period, of a same group of said sliding pieces being in the conductive state.

4. A position detecting device according to claim 3, wherein a code signal is generated according to the states of said sliding pieces, and said signal process means is adapted to read the code signal.

5. A position detecting device comprising:
   a member having conductive patterns arranged in plural tracks;
   a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;
   signal process means for repeatedly detecting which of said sliding pieces are in the conductive state; and
   discrimination means for identifying a relative position between said member having said conductive patterns and said sliding member, among a plurality of relative positions each indicated by a corresponding group of said sliding pieces being in the conductive state, said discrimination means identifying the relative position in response to said signal process means detecting a first group of said sliding pieces being in the conductive state and then detecting said first group of said sliding pieces or another group of said sliding pieces, indicating a relative position adjacent to that indicated by said first group being in the conductive state.

6. A position detecting device according to claim 5, wherein a code signal is generated according to the states of said sliding pieces, and said signal process means is adapted to read the code signal.

7. A position detecting device comprising:
   a member having conductive patterns arranged in plural tracks;
   a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;
   signal process means for repeatedly detecting which of said sliding pieces are in the conductive state; and
   discrimination means for identifying a relative position between said member having conductive patterns and said sliding member based on detection results of said signal process means;
   wherein said conductive patterns are formed such that, during normal operation of said sliding member, a predetermined group of said sliding pieces is in the conductive state at a reference position of said member having conductive patterns relative to said sliding member, and such that a malfunction of said sliding member that renders one or more of said sliding pieces non-conductive at any other relative position of said members cannot result in said predetermined group of said sliding pieces being in the conductive state.

8. A position detecting device according to claim 7, wherein a code signal is generated according to the states of said sliding pieces, and said signal process means is adapted to read the code signal.

9. A position detecting device comprising:

a member having conductive patterns arranged in plural tracks;

a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;

a signal processing section which repeatedly detects which of said sliding pieces are in the conductive state; and a discrimination section which identifies a relative position between said member having conductive patterns and said sliding member in response to detection, by said signal processing section, at least a predetermined plural number of times, of a same group of said sliding pieces being in the conductive state.

10. A position detecting device according to claim 9, wherein a code signal is generated according to the states of said sliding pieces, and said signal processing section is adapted to read the code signal.

11. A position detecting device comprising:

a member having conductive patterns arranged in plural tracks;

a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;

a signal processing section which repeatedly detects which of said sliding pieces are in the conductive state; and a discrimination section which identifies a relative position between said member having conductive patterns and said sliding member in response to repeated detections by said signal processing section, at least over a predetermined period, of a same group of said sliding pieces being in the conductive state.

12. A position detecting device according to claim 11, wherein a code signal is generated according to the states of said sliding pieces, and said signal processing section is adapted to read the code signal.

13. A position detecting device comprising:

a member having conductive patterns arranged in plural tracks;

a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;

a signal processing section which repeatedly detects which of said sliding pieces are in the conductive state; and a discrimination section which identifies a relative position between said member having said conductive patterns and said sliding member, among a plurality of relative positions each indicated by a corresponding group of said sliding pieces being in the conductive state, said discrimination section identifying the relative position in response to said signal processing section detecting a first group of said sliding pieces being in the conductive state and then detecting said first group of said sliding pieces or another group of said sliding pieces, indicating a relative position adjacent to that indicated by said first group, being in the conductive state.

14. A position detecting device according to claim 13, wherein a code signal is generated according to the states of said sliding pieces, and said signal processing section is adapted to read the code signal.

15. A position detecting device comprising:

a member having conductive patterns arranged in plural tracks;

a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;

a signal processing section which repeatedly detects which of said sliding pieces are in the conductive state; and a discrimination section which identifies a relative position between said member having conductive patterns and said sliding member based on detection results of said signal processing section;

wherein said conductive patterns are formed such that, during normal operation of said sliding member, a predetermined group of said sliding pieces is in the conductive state at a reference position of said member having conductive patterns relative to said sliding member, and such that a malfunction of said sliding member that renders one or more of said sliding pieces non-conductive at any other relative position of said members cannot result in said predetermined group of said sliding pieces being in the conductive state.

16. A position detecting device according to claim 15, wherein a code signal is generated according to the states of said sliding pieces, and said signal processing section is adapted to read the code signal.

17. A position detecting device comprising:

a member having conductive patterns arranged in plural tracks;

a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;

signal process means for repeatedly detecting which of said sliding pieces are in the conductive state; and discriminating means for identifying a relative position between said member having conductive patterns and said sliding member based on a plurality of detections by said signal process means.

18. A position detecting device according to claim 17, wherein a code signal is generated according to the states of said sliding pieces, and said signal process means is adapted to read the code signal.

19. A position detecting device comprising:

a member having conductive patterns arranged in plural tracks;

a sliding member having plural sliding pieces which slide on said conductive patterns, wherein each of said sliding pieces assumes either a conductive state in contact with a corresponding one of the conductive patterns or a non-conductive state not in contact with said corresponding conductive pattern, depending upon position of said sliding member relative to said member having conductive patterns;

a signal processing section which repeatedly detects which of said sliding pieces are in the conductive state; and a discriminating section which identifies a relative position between said member having conductive patterns and said sliding member based on a plurality of detections by said signal processing section.

20. A position detecting device according to claim 19, wherein a code signal is generated according to the states of said sliding pieces, and said signal processing section is adapted to read the code signal.

* * * * *